United States Patent [19]

Schwabe

[11] Patent Number: 4,462,149

[45] Date of Patent: Jul. 31, 1984

[54] METHOD FOR PRODUCING INTEGRATED MOS FIELD EFFECT TRANSISTORS WITH AN ADDITIONAL TRACK LEVEL OF METAL SILICIDES

[75] Inventor: Ulrich Schwabe, Munich, Fed. Rep. of Germany

[73] Assignee: Siemens Aktiengesellschaft, Berlin & Munich, Fed. Rep. of Germany

[21] Appl. No.: 396,727

[22] Filed: Jul. 9, 1982

[30] Foreign Application Priority Data

Aug. 19, 1981 [DE] Fed. Rep. of Germany ....... 3132809

[51] Int. Cl.³ .......................................... H01L 21/283
[52] U.S. Cl. .................................. 29/571; 29/577 C; 29/578; 29/591; 148/187
[58] Field of Search ............ 29/571, 578, 591, 577 C; 148/187

[56] References Cited

U.S. PATENT DOCUMENTS 4,080,719  3/1978  Wilting ........................... 148/187 X
4,102,733  7/1978  De La Moneda et al. ..... 148/187 X
4,273,805  6/1981  Dawson et al. ................. 148/187 X

FOREIGN PATENT DOCUMENTS 3027954  2/1982  Fed. Rep. of Germany .

Primary Examiner—G. Ozaki
Attorney, Agent, or Firm—Hill, Van Santen, Steadman & Simpson

[57] ABSTRACT

A method for producing integrated MOS field effect transistors, particularly complementary MOS field effect transistor circuits (CMOS-FET's) is provided wherein a metal silicide level, comprised preferably of tantalum silicide, is utilized as an additional interconnect (11). In this manner, all contact areas (9, 10, 13, 14, 15) to active (MOS) regions (6, 7) and polysilicon regions (5) for the metal silicide level (11) and also for the metal interconnect (12) are opened before the precipitation of the metal silicides. The structuring of the metal silicide level (11) is executed in such a manner that the p+ regions of the circuit remain protected during a flow-spread of an intermediate oxide (17) comprised of phosphorous glass.

5 Claims, 3 Drawing Figures

METHOD FOR PRODUCING INTEGRATED MOS FIELD EFFECT TRANSISTORS WITH AN ADDITIONAL TRACK LEVEL OF METAL SILICIDES

BACKGROUND OF THE INVENTION

1. Field of the Invention

The invention relates to a method of producing integrated MOS field effect transistors and somewhat more particularly to an improved method of producing complementary MOS field effect transistor circuits (CMOS-FET's).

2. Prior Art

German Offenlegungsschrift 30 27 954 describes a method for producing integrated MOS field effect transistors wherein a metal layer structure consisting of metal silicides having a high melting temperature, such as silicides of Mo, W, Ta or Ti, are utilized as an additional interconnect, with the metal silicides being applied after fabrication of the polysilicon level, the generation of active MOS regions, the application of the insulating oxide and the opening of the contact holes and in which a phosporous glass layer is utilized as an intermediate oxide between the metal silicide level and the metal interconnect. This technique is adequate for the manufacture of integrated MOS field effect transistors. However, with a transfer of these process steps into the manufacture of complementary MOS field effect transistor circuits (CMOS circuits) difficulties arise because a rounding of the rims and edges in the contact hole areas can only be performed before the etching of the contact holes. Otherwise, the p+ regions would be uncovered and a depletion of doping materials would occur in these regions due to the applied high temperature. Further, when opening the contact holes (aluminum to n+ regions, aluminum to p+ regions and aluminum to polysilicon regions) in integrated CMOS and NMOS circuits in which an additional interconnect is utilized, a problem occurs in that etching must be carried out in oxide layers of different thicknesses, resulting in a substantial undercutting of the contact holes.

SUMMARY OF THE INVENTION

The invention provides an improved method for the manufacture of CMOS circuits with employment of an additional interconnect composed of a metal silicide, in which:

1. A flow-spread of a phosphorous glass layer functioning as an intermediate oxide is utilized for rounding the contact hole rims and edges without uncovering the p+ regions of the circuit; and
2. The formed contact holes exhibit no undercutting.

In accordance with the principles of the invention, the earlier described technique is improved by substantially simultaneously opening the contact areas to the active MOS and polysilicon regions, both for the metal silicide level and for the metal interconnect in one method step, after the application of the insulating oxide and before the precipitation of the metal silicides and by executing the structuring of the metal silicide level in such a manner that when the phosphorous glass layer, functioning as the intermediate oxide, is allowed to spread, the p+ regions of the circuit remain covered by the metal silicide layer.

In certain embodiments of the invention, a layer of tantulum silicide (TaSi$_2$) in a thickness ranging from about 200 through 500 nm is utilized as the metal silicide layer and aluminum is utilized as the metal interconnect. In certain embodiments of the invention, the phosphorous glass layer functioning as the intermediate oxide is deposited in a layer thickness of about 1000 nm and is caused to spread (melt) at a temperature of about 1000° C.

DESCRIPTION OF THE PREFERRED EMBODIMENTS

Figure 1:
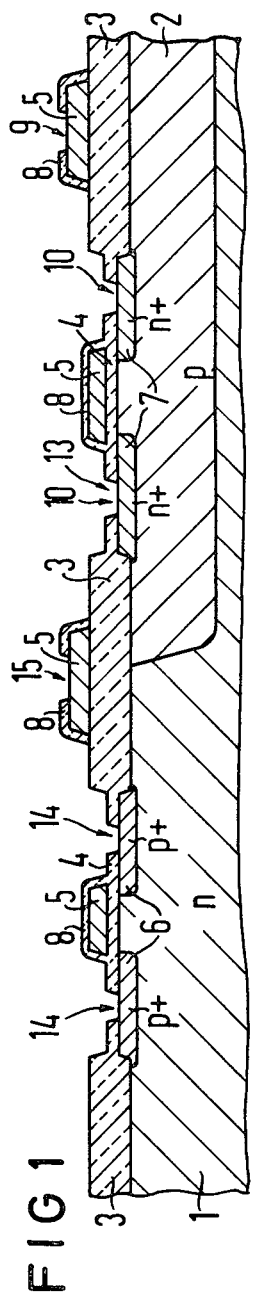
FIGS. 1–3 are partial, cross-sectional, enlarged schematic views illustrating various stages of an exemplary structure undergoing fabrication in accordance with the principles of the invention with a p-well CMOS process.
Figure 2:
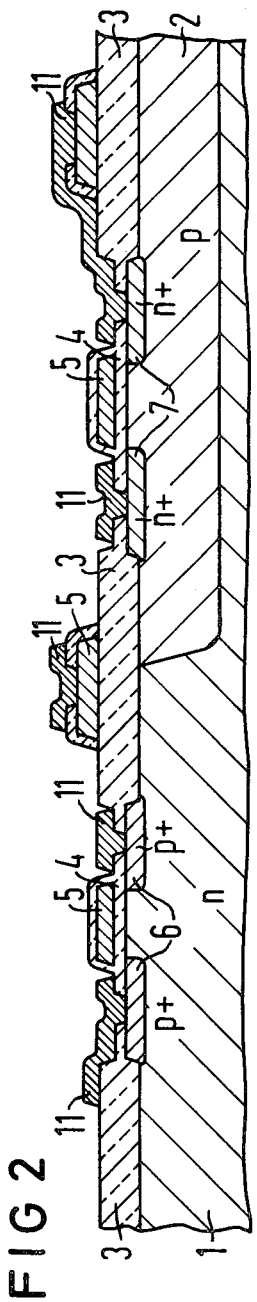

In the drawings, identical reference numerals are utilized to designate identical parts, except where otherwise specified.

FIG. 1

With a p-well CMOS process, fabrication occurs as follows: in order to form the p-well, boron is implanted on a silicon substrate 1 doped with phosphorus and is diffused in during a high temperature step. Subsequently, the layer sequence for oxidation is produced which defines an active region, p-well regions 2 are covered with a photosensitive resist, phosphorous (not shown) is implanted into the field regions, the photosensitive resist is removed, field oxide regions 3 are generated by oxidation, a silicon nitride mask is removed and boron (not shown) is implanted for setting the threshold voltage of the n- and p- MOS-FET's. Subsequently, the gate oxide 4 is re-grown, a 350 nm polysilicon layer 5 is deposited and doped with phosphorous and is structured. All regions, except for the source-drain regions 6 of the p-MOS-FET's and the contact regions to the n-substrate 1, are covered with a photosensitive resist, boron (not shown) is implanted and the photosensitive resist is removed. All regions, except for the source-drain regions of the n-MOS-FET's 7 and the contact regions to the p-wells 2, are covered, arsenic (not shown) is implanted and the photosensitive resist is removed. The overall arrangement is then oxidized at 800° to 900° C. in a wet atmosphere. The insulating oxide 8 formed in this manner has a thickness of about 200 nm over the polysilicon regions 5. The contacts are then opened, both for the additional interconnect 11, composed, in the exemplary embodiment under discussion, of tantalum silicide, for the TaSi$_2$-polysilicon level 9 and the TaSi$_2$-n+ regions 10, as well as for the interconnect 12, composed, in the exemplary embodiment under discussion, of aluminum, for the Al-n+ regions 13, the Al-p+ region 14 and the Al-polysilicon level 15. The resultant structuring is illustrated at FIG. 1.

FIG. 2

After conclusion of the first contact hole etching operation, the additional interconnect 11, composed of a metal silicide, preferably tantalum silicide, is deposited in a layer thickness ranging from about 200 through 500 nm and structured in such a manner that an oversized metal silicide spot remains over all contact holes 9, 10, 14 and 15.

FIG. 3

Figure 3:
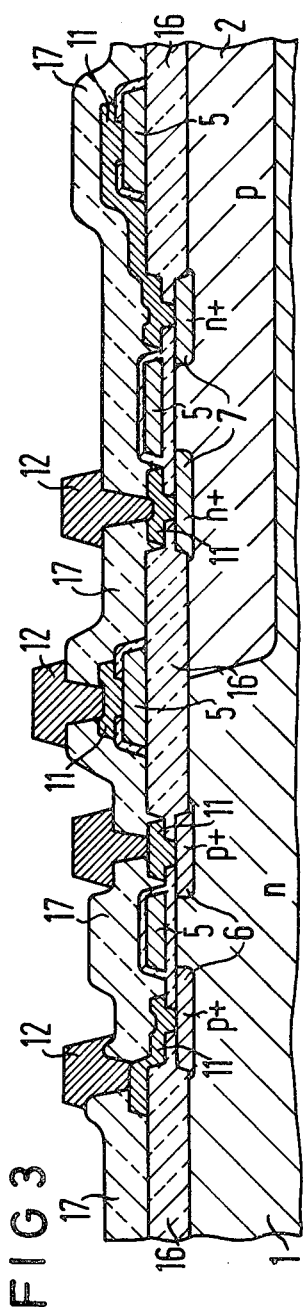

In FIG. 3, the overall oxide layer consisting of gate oxide 4, field oxide 3 and insulating oxide 8 is referenced with numeral 16 for purposes of improved clarity. The intermediate oxide 17, consisting of phosphorous silicate glass, is now deposited in a layer thickness of about 1000 nm and a second contact hole etching (for contact holes 9, 10, 14 and 15) occurs. Subsequently, the flow-spread of the phosphorous glass layer 17 occurs at a temperature of about 1000° C. for rounding the contact hole regions (9, 10, 14, 15) and during this stage, the p+ regions 6 are protected by portions of the tantalum silicide layer 11 lying over such regions. Finally, an interconnect comprised of aluminum or aluminum/silicon is provided in a known manner.

In addition to the advantage that the melt- or flow-spread of the phosphorous glass layer 17 in the manufacture of CMOS circuits can occur after a second contact hole etching because the p+ regions 6 are masked or protected by the "silicide mushrooms," the use of such "silicide mushrooms" over each contact hole (9, 10, 14 and 15) also produces the advantage that a substantially identical oxide thickness exists over all regions during the second contact hole etching so that undercutting is avoided.

Further, the packing density of the integrated circuits manufactured in this manner is increased because, as can be seen from FIG. 3, the contact 12 can also be positioned over the thick oxide regions.

As is apparent from the foregoing specification, the present invention is susceptible of being embodied with various alterations and modifications which may differ particularly from those that have been described in the preceeding specification and description. For this reason, it is to be fully understood that all the foregoing is intended to be merely illustrative and is not to be construed or interpreted as being restrictive or otherwise limiting of the present invention, excepting as it set forth and defined in the hereto-appended claims.

I claim as my invention:

1. In a method of producing integrated MOS field effect transistors, particularly complementary MOS field effect transistor circuits (CMOS-FET's) wherein a metal layer structure consisting of a metal silicide having a high melting point, comprising a silicide of molybdenum, tungsten, tantalum or titanium, is utilized as an additional interconnect, with the metal silicide layer being applied after the fabrication of the polysilicon level, the forming of active MOS regions, the application of an insulating oxide and the opening of contact holes, and phosphorous glass layer is utilized as an intermediate oxide between the metal silicide level and the metal interconnect, wherein the improvement comprises:
   substantially simultaneously opening, in one method step, contact areas to the active MOS and polysilicon regions for the metal silicide level as well as for the metal interconnect after the application of the insulating oxide and before the application of the metal silicide level; and
   structuring the metal silicide level in such a manner that during a flow-spread of the phosphorous glass layer functioning as an intermediate oxide, the p+ regions of the circuit remain covered by the metal silicide level.

2. In a method as defined in claim 1, wherein tantalum silicide ($TaSi_2$) in a layer thickness ranging from about 200 through 500 nm is utilized as the metal silicide level.

3. In a method as defined in claim 1, wherein aluminum is utilized for forming the metal interconnect.

4. In a method as defined in claim 1, wherein the phosphorous glass layer is deposited in a thickness of about 1000 nm and caused to flow-spread at a temperature of about 1000° C.

5. In a method as defined in claim 1, wherein tantalum silicide ($TaSi_2$) in a layer thickness ranging from about 200 through 500 nm is utilized for forming the metal silicide level, aluminum is utilized for forming the metal interconnect and the phosphorous glass layer is deposited in a layer thickness of about 1000 nm and caused to flow-spread at a temperature of about 1000° C.

* * * * *